(12) United States Patent
Aihara

(10) Patent No.: US 6,825,507 B2
(45) Date of Patent: Nov. 30, 2004

(54) SEMICONDUCTOR DEVICE HAVING HIGH ELECTRON MOBILITY COMPRISING A SIGE/SI/SIGE SUBSTRATE

(75) Inventor: Kazuhiro Aihara, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/346,976

(22) Filed: Jan. 21, 2003

(65) Prior Publication Data

US 2004/0036122 A1 Feb. 26, 2004

(30) Foreign Application Priority Data

Aug. 21, 2002 (JP) ........................................ 2002-240537

(51) Int. Cl.$^7$ ................. H01L 31/0328; H01L 31/0336; H01L 31/117
(52) U.S. Cl. ........................ 257/192; 257/190; 257/616
(58) Field of Search ............................... 257/368, 190, 257/192, 194, 195, 616

(56) References Cited

U.S. PATENT DOCUMENTS 5,461,250 A  10/1995 Burghartz et al.
6,555,839 B2 * 4/2003 Fitzgerald .................. 257/192
6,680,496 B1 * 1/2004 Hammond et al. ......... 257/192

FOREIGN PATENT DOCUMENTS

| JP | 05-235334 | 9/1993 |
| JP | 07-288323 | 10/1995 |
| JP | 07-335888 | 12/1995 |

* cited by examiner

*Primary Examiner*—Steven Loke
(74) *Attorney, Agent, or Firm*—McDermott Will & Emery LLP

(57) ABSTRACT

An Si crystal film functioning as a channel region is formed on an SiGe crystal film substrate. Furthermore, an SiGe crystal film functioning as a channel region is formed on the Si crystal film. In addition, on the opposite sides of the SiGe crystal film and the Si crystal film, an Si crystal film functioning as a source/drain region is formed. Moreover, a gate electrode is formed on the SiGe crystal film with a gate insulator film interposed. In accordance with the configuration described above, SiGe crystal film prevents the native oxidation of the Si crystal film. As a result, it is possible to obtain a semiconductor device that solves a problem caused by decrease in a conductivity in the Si crystal film resulting from the native oxidation of a surface of the Si crystal film.

6 Claims, 2 Drawing Sheets

SEMICONDUCTOR DEVICE HAVING HIGH ELECTRON MOBILITY COMPRISING A SIGE/SI/SIGE SUBSTRATE

BACKGROUND OF THE INVENTION

1. Field of the Invention

The present invention relates to a semiconductor device with a semiconductor substrate.

2. Description of the Background Art

As a transistor made of semiconductor, which is an example of a semiconductor device with a semiconductor substrate, transistors of a DRAM (Dynamic Random Access Memory) are widely known. FIG. 5 is a sectional view of a conventional transistor of a DRAM. The conventional transistor of a DRAM depicted in FIG. 5 has the following structure.

In the conventional transistor, an SiGe crystal film substrate 2 containing a p type impurity is formed on a semiconductor substrate 1. Furthermore, an Si crystal film 4 containing a p type impurity, which functions as a channel region, is formed on SiGe crystal film substrate 2. In addition, on opposite sides of Si crystal film 4, an Si crystal film 3 containing an n type impurity, which functions as a source/drain region, is formed. Moreover, a gate electrode 6 is formed on Si crystal film 4 with a gate insulator film 5 interposed.

The aforementioned Si crystal film 3, Si crystal film 4, gate insulator film 5, and gate electrode 6 together form an n channel transistor 7.

In the conventional transistor described above, Si crystal film 4 is formed on SiGe crystal film substrate 2. Therefore, a lattice distortion is produced in Si crystal film 4. As a result, the mobility of electrons flowing in Si crystal film 4 is improved, i.e, the conventional transistor increases a drain current by utilizing Si crystal film 4 formed on SiGe crystal film substrate 2 as a material of a channel region.

It is noted that, in a conventional technique, Si crystal film 4 is described as an example of a conductive portion formed in a semiconductor substrate, in which electrons flow, and that SiGe crystal film 2 is described as an example of a mobility-improving portion contacting a lower surface of the conductive portion to produce a lattice distortion in semiconductor constituting the conductive portion to improve the mobility of electrons flowing in the conductive portion.

The conventional transistor described above has a structure in which a surface of Si crystal film 4 as a channel region contacts the gate insulator film. Thus, in the step of forming gate insulator film 5, the surface of Si crystal film 4 is exposed. Because of such a structure, a native oxide or the like tends to be formed on the surface of Si crystal film 4 as an example of a conductive portion. Consequently, after gate insulator film 5 is formed, the surface of Si crystal film 4 is oxidized because of the existence of gate insulator film 5. This results in a decrease in dielectric constant of gate insulator film 5 itself. This eventually makes a channel region formed in Si crystal film 4 incomplete, when a voltage is applied to the gate electrode. As a result, a problem arises that a desired drain current cannot be obtained.

Furthermore, in the conventional transistor, a surface of Si crystal film 3 as a source/drain region is in contact with a conductive member (e.g. contact plug) passing a current through the source/drain region. In this step of forming the conductive member as well, a surface of Si crystal film 3 is exposed. Because of such a structure, in the conventional transistor, a native oxide or the like tends to be formed on the surface of Si crystal film 3 as an example of a conductive portion, and this increases a contact resistance between a conductive member and Si crystal film 3 as a source/drain region. As a result, a problem arises that the operating speed of a transistor decreases.

SUMMARY OF THE INVENTION

An object of the present invention is to provide a semiconductor device that solves the problem caused by a decrease in conductivity in a conductive portion resulting from a native oxidation of a surface of a conductive portion.

Another object is to provide a semiconductor device that solves the problem caused by a decrease in conductivity in an Si crystal film resulting from a native oxidation of a surface of an Si crystal film.

In accordance with one aspect of the present invention, a semiconductor device includes a semiconductor substrate. The semiconductor substrate includes a conductive portion in which electrons flow, a mobility-improving portion contacting a lower surface of the conductive portion to produce a lattice distortion in semiconductor constituting the conductive portion to improve the mobility of electrons flowing in the conductive portion, and an oxidation-suppressing portion overlaying an upper surface of the conductive portion while constituting a surface of the semiconductor substrate to prevent native-oxidation of the conductive region.

In accordance with the configuration described above, the surface layer of the semiconductor substrate is made from the oxidation-suppressing portion less susceptible to native-oxidation, so that the problem resulting from the native oxidation of the surface layer of the semiconductor substrate is solved. In addition, electrons move in the conductive portion in which a lattice distortion is produced by the influence of the mobility-improving portion, so that the mobility of the electrons is improved.

In accordance with another aspect of the present invention, the semiconductor device includes a semiconductor substrate including an Si layer formed on a first SiGe layer, and a second SiGe layer formed on and in contact with the Si layer and constituting a surface layer, and the semiconductor device is utilized in a manner that electrons move in the Si layer.

In accordance with the configuration described above, the surface layer of the semiconductor substrate is made from a second SiGe layer less susceptible to native-oxidation, so that the problem resulting from the native oxidation of the surface layer of the semiconductor substrate is solved. In addition, electrons move in the Si layer in which a lattice distortion is produced by the influence of a first SiGe layer, so that the mobility of the electrons is not decreased. Furthermore, it is the first SiGe layer producing a lattice distortion in the Si layer that is formed on the surface of the Si layer, and therefore, decrease in the mobility of the electrons is less likely.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following, a semiconductor device in accordance with embodiments of the present invention will be described with reference to FIGS. 1 to 4.

(First Embodiment)

First, a semiconductor device in accordance with a first embodiment of the present invention will be described with reference to FIG. 1.

Figure 1:
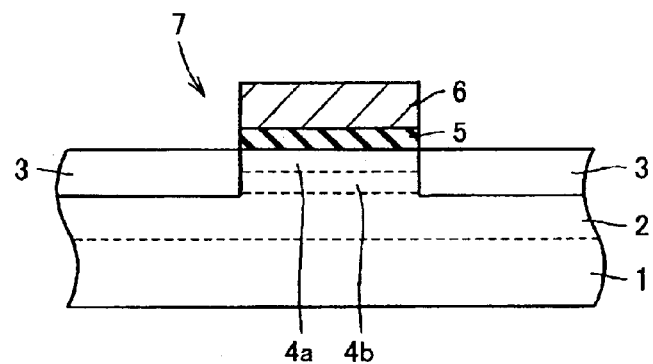
FIG. 1 is a sectional view of a semiconductor device in accordance with a first embodiment of the present invention.

As shown in FIG. 1, in a semiconductor device in accordance with the present embodiment, an SiGe crystal film substrate 2 containing a p type impurity is formed on a semiconductor substrate 1. Furthermore, an Si crystal film 4b containing a p type impurity, which functions as a channel region, is formed on SiGe crystal film substrate 2. In addition, an SiGe crystal film 4a containing a p type impurity, which functions as a channel region, is formed on Si crystal film 4b. Moreover, on opposite sides of SiGe crystal film 4a and Si crystal film 4b, an Si crystal film 3 containing an n type impurity, which functions as a source/drain region, is formed. In addition, a gate electrode 6 is formed on SiGe crystal film 4a with a gate insulator film 5 interposed. It is noted that SiGe crystal film 4a is a very thin film.

The aforementioned Si crystal film 3, SiGe 4a, Si 4b, gate insulator film 5, and gate electrode 6 together form an n channel transistor 7.

In the semiconductor device in accordance with the present embodiment described above, SiGe crystal film 4a less susceptible to native-oxidation is used as a surface layer of the channel region. Therefore, it is possible to form gate insulator film 5 without developing a native oxide at the surface of the channel region. As a result, decrease in dielectric constant of the gate insulator film can be suppressed. Thus, it is possible to prevent the channel region from operating unsatisfactorily when a voltage is applied to the gate electrode. Consequently, the transistor can obtain a desired drain current.

In addition, in the semiconductor device in accordance with the present embodiment described above, Si crystal film 4b having a lattice distortion therein is formed in the channel region. Therefore, it is possible to obtain a desired drain current without decreasing the mobility of the electrons flowing in the channel region.

Furthermore, SiGe crystal film 4a producing a lattice distortion in Si crystal film 4b is formed on the surface of Si crystal film 4b, and therefore, decrease in the mobility of the electrons is less likely.

(Second Embodiment)

Figure 2:
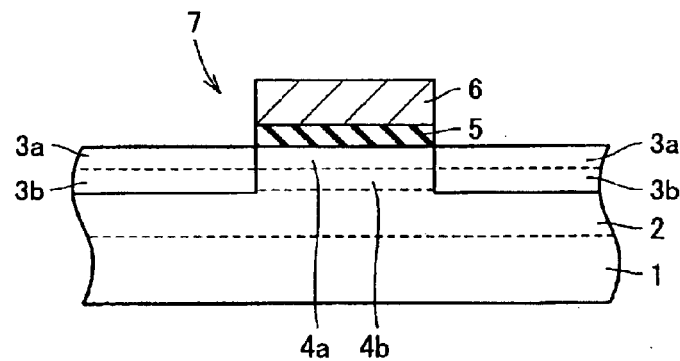
FIG. 2 is a sectional view of the semiconductor device in accordance with a second embodiment of the present invention.

The semiconductor device in accordance with a second embodiment of the present invention will now be described with reference to FIG. 2. As shown in FIG. 2, in the semiconductor device in accordance with the present embodiment, SiGe crystal film substrate 2 containing a p type impurity is formed on semiconductor substrate 1. Si crystal film 4b containing a p type impurity, which functions as a channel region, is formed on SiGe crystal film substrate 2. Furthermore, SiGe crystal film 4a containing a p type impurity, which functions as a channel region, is formed on Si crystal film 4b. In addition, on opposite sides of SiGe crystal film 4a and Si crystal film 4b, Si crystal film 3b containing an n type impurity and SiGe crystal film 3a containing an n type impurity placed on Si crystal film 3b, which function as a source/drain region, are formed. Gate electrode 6 is formed on SiGe crystal film 4a with gate insulator film 5 interposed. It is noted that SiGe crystal film 4a containing a p type impurity is a very thin film.

The aforementioned SiGe crystal film 3a, Si crystal film 3b, SiGe crystal film 4a, Si crystal film 4b, gate insulator film 5, and gate electrode 6 together form n channel transistor 7.

In the semiconductor device in accordance with the present embodiment described above, SiGe crystal film 4a less susceptible to native-oxidation is used as the surface layer of the channel region. Therefore, similar to the semiconductor device in accordance with a first embodiment, the transistor can obtain a desired drain current.

In addition, in the semiconductor device in accordance with the present embodiment described above, Si crystal film 4b having a lattice distortion therein is formed in the channel region. Therefore, it is possible to obtain a desired drain current without decreasing the mobility of the electrons flowing in the channel region.

Furthermore, SiGe crystal film 4a producing a lattice distortion in Si crystal film 4b is formed on the surface of Si crystal film 4b, and therefore, decrease in the mobility of the electrons is less likely.

Moreover, in the semiconductor device in accordance with the present embodiment, SiGe crystal film 3a less susceptible to native-oxidation is used as the surface layer of the source/drain region. Therefore, it is possible to connect a conductive member directly to the surface of the source/drain region without developing a native oxide at the surface of the source/drain region. As a result, increase in contact resistance between the source/drain region and the conductive member connected to the source/drain region can be suppressed. Consequently, decrease in the operating speed of the transistor is suppressed.

In addition, the resistivity of SiGe crystal film 3a is significantly lower than that of Si crystal film 3b. Therefore, the resistance of the source/drain region can be adequately lowered. Consequently, it is possible to promote a high speed operation of the transistor.

Furthermore, SiGe crystal film 3a producing a lattice distortion in Si crystal film 3b is formed on the surface of Si crystal film 3b, and therefore, decrease in the mobility of the electrons is less likely.

(Third Embodiment)

The semiconductor device in accordance with a third embodiment of the present invention will now be described with reference to FIG. 3.

Figure 3:
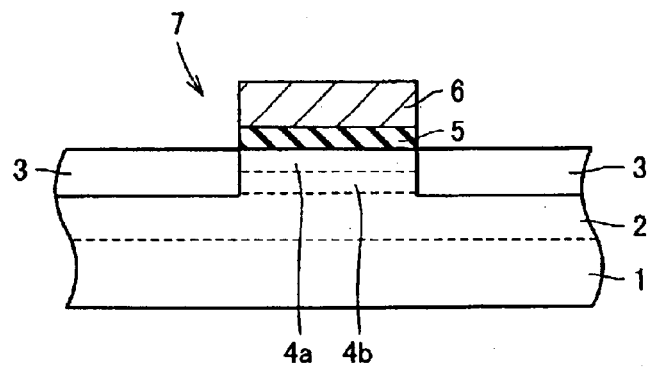
FIG. 3 is a sectional view of the semiconductor device in accordance with a third embodiment of the present invention.

As shown in FIG. 3, in the semiconductor device in accordance with the present embodiment, SiGe crystal film substrate 2 containing an n type impurity is formed on semiconductor substrate 1. Furthermore, Si crystal film 4b containing an n type impurity, which functions as a channel region, is formed on SiGe crystal film substrate 2. In addition, SiGe crystal film 4a containing an n type impurity, which functions as a channel region, is formed on Si crystal film 4b. Moreover, on opposite sides of SiGe crystal film 4a and Si crystal film 4b, Si crystal film 3 containing a p type impurity, which functions as a source/drain region, is formed. In addition, gate electrode 6 is formed on SiGe crystal film 4a with gate insulator film 5 interposed. It is noted that SiGe crystal film 4a containing an n type impurity is a very thin film.

The aforementioned Si crystal film 3, SiGe crystal film 4a, Si crystal film 4b, gate insulator film 5, and gate electrode 6 together form a p channel transistor 7.

The semiconductor device in accordance with the present embodiment is different from the semiconductor device in accordance with the first embodiment, only in that n type and p type are reversed with each other.

In the semiconductor device in accordance with the present embodiment described above, similar to the semiconductor device in accordance with the first embodiment, SiGe crystal film 4a less susceptible to native-oxidation is used as the surface layer of the channel region. Therefore, it is possible to form gate insulator film 5 without developing a native oxide at the surface of the channel region. As a result, decrease in dielectric constant of the gate insulator film can be suppressed. Thus, it is possible to prevent the channel region from operating unsatisfactorily when a voltage is applied to the gate electrode. Consequently, the transistor can obtain a desired drain current.

In addition, in the semiconductor device in accordance with the present embodiment described above, similar to the semiconductor device in accordance with the first embodiment, Si crystal film 4b having a lattice distortion therein is formed in the channel region. Therefore, it is possible to obtain a desired drain current without decreasing the mobility of the electrons flowing in the channel region.

Furthermore, SiGe crystal film 4a producing a lattice distortion in Si crystal film 4b is formed on the surface of Si crystal film 4b, and therefore, decrease in the mobility of the electrons is less likely.

(Fourth Embodiment)

The semiconductor device in accordance with a fourth embodiment of the present invention will now be described with reference to FIG. 4.

Figure 4:
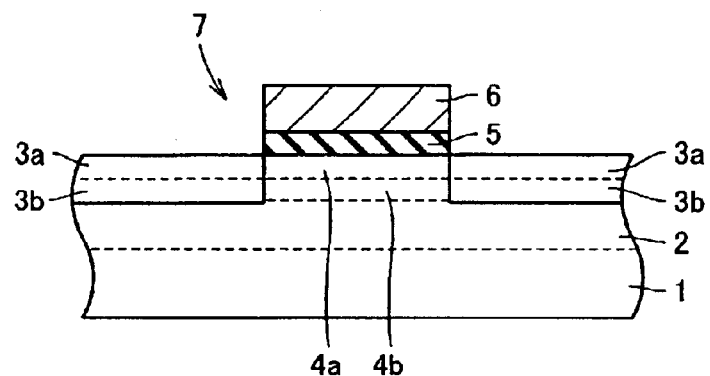
FIG. 4 is a sectional view of the semiconductor device in accordance with a fourth embodiment of the present invention.
Figure 5:
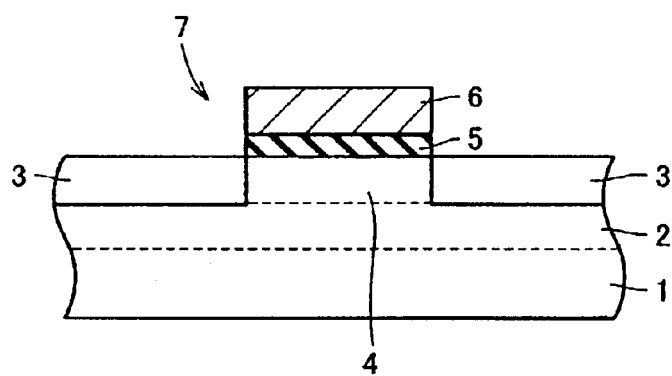
FIG. 5 is a sectional view of a conventional semiconductor device.

As shown in FIG. 4, in the semiconductor device in accordance with the present embodiment, SiGe crystal film substrate 2 containing an n type impurity is formed on semiconductor substrate 1. Furthermore, Si crystal film 4b containing an n type impurity, which functions as a channel region, is formed on SiGe crystal film substrate 2. In addition, SiGe crystal film 4a containing an n type impurity, which functions as a channel region, is formed on Si crystal film 4b. Moreover, on opposite sides of SiGe crystal film 4a and Si crystal film 4b, Si crystal film 3b containing a p type impurity and SiGe crystal film 3a containing a p type impurity placed on Si crystal film 3b, which function as a source/drain region, are formed. In addition, gate electrode 6 is formed on SiGe crystal film 4a with gate insulator film 5 interposed. It is noted that SiGe crystal film 4a containing an n type impurity is a very thin film.

The aforementioned SiGe crystal film 3a, Si crystal film 3b, SiGe crystal film 4a, Si crystal film 4b, gate insulator film 5, and gate electrode 6 together form p channel transistor 7.

The semiconductor device in accordance with the present embodiment is different from the semiconductor device in accordance with the second embodiment, only in that n type and p type are reversed with each other.

In the semiconductor device in accordance with the present embodiment described above, similar to the semiconductor device in accordance with the second embodiment, SiGe crystal film 4a less susceptible to native-oxidation is used as the surface layer of the channel region. Therefore, similar to the semiconductor device in accordance with the second embodiment, the transistor can obtain a desired drain current.

In addition, in the semiconductor device in accordance with the present embodiment described above, similar to the semiconductor device in accordance with the second embodiment, Si crystal film 4b having a lattice distortion therein is formed in the channel region. Therefore, it is possible to obtain a desired drain current without decreasing the mobility of the electrons flowing in the channel region.

Furthermore, SiGe crystal film 4a producing a lattice distortion in Si crystal film 4b is formed on the surface of Si crystal film 4b, and therefore, decrease in the mobility of the electrons is less likely.

In addition, in the semiconductor device in accordance with the present embodiment, similar to the semiconductor device in accordance with the second embodiment, SiGe crystal film 3a less susceptible to native-oxidation is used as the surface layer of the source/drain region. Therefore, it is possible to connect a conductive member directly to the surface of the source/drain region without developing a native oxide at the surface of the source/drain region. As a result, increase in contact resistance between the source/drain region and the conductive member connected to the source/drain region can be suppressed. Consequently, decrease in the operating speed of the transistor is suppressed.

In addition, the resistivity of SiGe crystal film 3a is significantly lower than that of Si crystal film 3b. Therefore, the resistance of the source/drain region can be adequately lowered. Consequently, it is possible to promote a high speed operation of the transistor.

Furthermore, SiGe crystal film 3a producing a lattice distortion in Si crystal film 3b is formed on the surface of Si crystal film 3b, and therefore, decrease in the mobility of the electrons is less likely.

(Fifth Embodiment)

A structure of the semiconductor device in accordance with the present embodiment is similar to that of the semiconductor device in accordance with any of the first to fourth embodiments described with reference to FIGS. 1 to 4. However, in the structures of the semiconductor devices in accordance with the first to fourth embodiments, gate insulator films are simply described as dielectric films, whereas in the semiconductor device in accordance with the present embodiment, $Al_2O_3$ film or $HfO_2$ film as high dielectric film is utilized as an insulator film. As a result, in accordance with the semiconductor device of the present embodiment, it is possible to prevent the native oxidation of the high dielectric film of which performance could otherwise be significantly degraded by the native oxidation.

It is noted that in the semiconductor devices in accordance with the first to fourth embodiments described above, Si crystal films 3b and 4b are utilized as conductive portions of the present invention, in which electrons flow and which are formed in the semiconductor substrate. In addition, SiGe crystal film substrate 2 is utilized as a mobility-improving portion of the present invention, contacting a lower surface of the conductive portion to produce a lattice distortion in semiconductor constituting the conductive portion to improve the mobility of the electrons flowing in said conductive portion. Furthermore, SiGe crystal films 3a and 4a are utilized as oxidation-suppressing portions overlaying an upper surface of the conductive portion while constituting a surface of the semiconductor substrate to prevent native-oxidation of the conductive region.

In accordance with the configuration described above, a surface layer of the semiconductor substrate is made from the oxidation-suppressing portion less susceptible to native-oxidation, so that the problem resulting from the native oxidation of the surface layer of the semiconductor substrate is solved. In addition, electrons move in the conductive portion in which a lattice distortion is produced by the influence of the mobility-improving portion, so that the mobility of the electrons is improved.

Furthermore, SiGe crystal films 3a and 4a as oxidation-suppressing portions improve the mobility of the electrons flowing in Si crystal films 3b and 4b as conductive portions.

In accordance with the configuration described above, the mobility of the electrons in the conductive portion is further improved.

In addition, SiGe crystal films 3a and 4a as oxidation-suppressing portions and SiGe crystal film substrate 2 as a mobility-improving portion are composed of a substance of the same composition.

In accordance with the configuration described above, the oxidation-suppressing portion also produces a lattice distortion in the conductive portion, and therefore, decrease in the mobility of the electrons is less likely.

Furthermore, in the semiconductor devices in accordance with the first to fourth embodiments, SiGe crystal films are utilized as films sandwiching the Si crystal films therebetween. Instead of the SiGe crystal films, however, an SiGeC crystal film may be used to obtain the effect similar to that of the semiconductor devices in accordance with the first to fourth embodiments.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising a semiconductor substrate, said semiconductor substrate including:
    a conductive portion in which electrons flow;
    a mobility-improving portion contacting a lower surface of said conductive portion to produce a lattice distortion in semiconductor constituting said conductive portion for improving mobility of electrons flowing in said conductive portion; and
    an oxidation-suppressing portion overlaying an upper surface of said conductive portion and constituting a surface of said semiconductor substrate to prevent native-oxidation of said conductive portion; wherein;
    the oxidation-suppressing portion is provided beneath a gate insulating film comprising an $Al_2O_3$ film or $HfO_2$ film; and
    the oxidation-suppressing portion and underlying conductive portion function as a channel region of a transistor.

2. The semiconductor device according to claim 1, wherein said oxidation-suppressing portion has function to improve the mobility of the electrons flowing in said conductive portion.

3. The semiconductor device according to claim 1, wherein said oxidation-suppressing portion and said mobility-improving portion are composed of a substance of the same composition.

4. A semiconductor device comprising a semiconductor substrate, said semiconductor substrate including:
    an Si layer formed on a first SiGe layer, in which electrons flow; and
    a second SiGe layer formed on and in contact with said Si layer and constituting a surface layer of said semiconductor substrate, wherein;
    said second SiGe layer is provided beneath a gate insulating film comprising an $Al_2O_3$ film or $HfO_3$ film; and
    said Si layer and said second SiGe layer are utilized as a channel region of a transistor.

5. A semiconductor device comprising a semiconductor substrate, said semiconductor substrate including:
    an Si layer formed on a first SiGe layer, in which electrons flow; and
    a second SiGe layer formed on and in contact with said Si layer and constituting a surface layer of said semiconductor substrate; wherein:
    a first portion of said Si layer and said second SiGe layer are utilized as a channel region of a transistor; and wherein
    a second portion of said Si layer and said second SiGe layer are utilized as a source/drain region of a transistor.

6. A semiconductor device comprising a semiconductor substrate, said semiconductor substrate including:
    a conductive portion in which electrons flow;
    a mobility-improving portion contacting a lower surface of said conductive portion to produce a lattice distortion in semiconductor constituting said conductive portion for improving mobility of electrons flowing in said conductive portion; and
    an oxidation-suppressing portion overlaying an upper surface of said conductive portion and constituting a surface of said semiconductor substrate to prevent native-oxidation of said conductive portion; wherein
    a first part of the oxidation-suppressing portion and underlying conductive portion function as a channel region and a second part of the oxidation-suppressing portion and underlying conductive portion are utilized as a source/drain region of a transistor.

* * * * *

UNITED STATES PATENT AND TRADEMARK OFFICE
CERTIFICATE OF CORRECTION

PATENT NO. : 6,825,507 B2
DATED : November 30, 2004
INVENTOR(S) : Kazuhiro Aihara It is certified that error appears in the above-identified patent and that said Letters Patent is hereby corrected as shown below:

Title page, Item [54] and Column 1, line 3,
Title, change "SIGE/SI/SIGE SUBSTRATE" to -- SiGe/Si/SiGe SUBSTRATE --;

Column 2,
Line 54, change "it is the first SiGe layer" to -- it is the second SiGe layer --;

Column 8,
Line 19, change "$HfO_3$ film" to -- $HfO_2$ film --.

Signed and Sealed this

Twenty-fourth Day of May, 2005

JON W. DUDAS
*Director of the United States Patent and Trademark Office*